(12) United States Patent
Pei

(10) Patent No.: US 8,574,412 B2
(45) Date of Patent: Nov. 5, 2013

(54) MAGNET MOUNTING SYSTEM AND MAGNETRON SPUTTERING DEVICE HAVING SAME

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 317 days.

(21) Appl. No.: 12/967,001

(22) Filed: Dec. 13, 2010

(65) Prior Publication Data
US 2012/0073965 A1     Mar. 29, 2012

(30) Foreign Application Priority Data
Sep. 23, 2010 (TW) ................................ 99132190 A

(51) Int. Cl.
*C23C 14/35* (2006.01)
(52) U.S. Cl.
USPC .................... 204/298.2; 204/298.19; 335/306
(58) Field of Classification Search
USPC ........................... 204/298.19, 298.2; 335/306
See application file for complete search history.

(56) References Cited

FOREIGN PATENT DOCUMENTS

| JP | 09-186000 | * | 7/1997 |
| JP | 2001-158961 | * | 6/2001 |

OTHER PUBLICATIONS

Machine Translation of JP 2001-158961 dated Jun. 2001.*
Machine Translation of 09-186000 dated Jul. 1997.*

* cited by examiner

*Primary Examiner* — Rodney McDonald
(74) *Attorney, Agent, or Firm* — Altis & Wispro Law Group, Inc.

(57) ABSTRACT

A magnetron sputtering device includes a main body and a magnet mounting system for receiving magnets. The magnet mounting system comprises a first annular member, a second annular member coaxially encasing the first member, a third annular member coaxially encasing the second member, a first driving device connected to the first annular member, a second driving device connected to the second annular member, and a third driving device connected to the third annular member. The first driving device, the second driving device, and the third driving device are respectively configured for driving the first annular member, the second annular member, and the third annular member to move along an axis of the first annular member.

15 Claims, 5 Drawing Sheets

MAGNET MOUNTING SYSTEM AND MAGNETRON SPUTTERING DEVICE HAVING SAME

BACKGROUND

1. Technical Field

The present disclosure relates to coating technologies and, particularly, to a magnetron sputtering device.

2. Description of Related Art

A magnetron sputtering device often includes a main body defining a cavity from which, during coating, atmosphere is evacuated to be replaced by an insert gas such as argon (Ar), atoms of which are ionized to Ar ions. The Ar ions bombard a target so atoms of the target are sputtered and deposited workpieces. A magnetic field formed by a permanent magnet fixed in the main body. Magnetic fields of the magnets are superposed, and magnetic density around the outer surface of the target may not be uniform, with more Ar ions are accelerated to portions of the outer surface of the target where the magnetic density is high and less reaching other portions where the magnetic density is low. Efficiency of the process is thus low.

What is needed, therefore, is a magnet mounting system and a magnetron sputtering device utilizing the system to overcome the described limitations.

DETAILED DESCRIPTION

Figure 1:
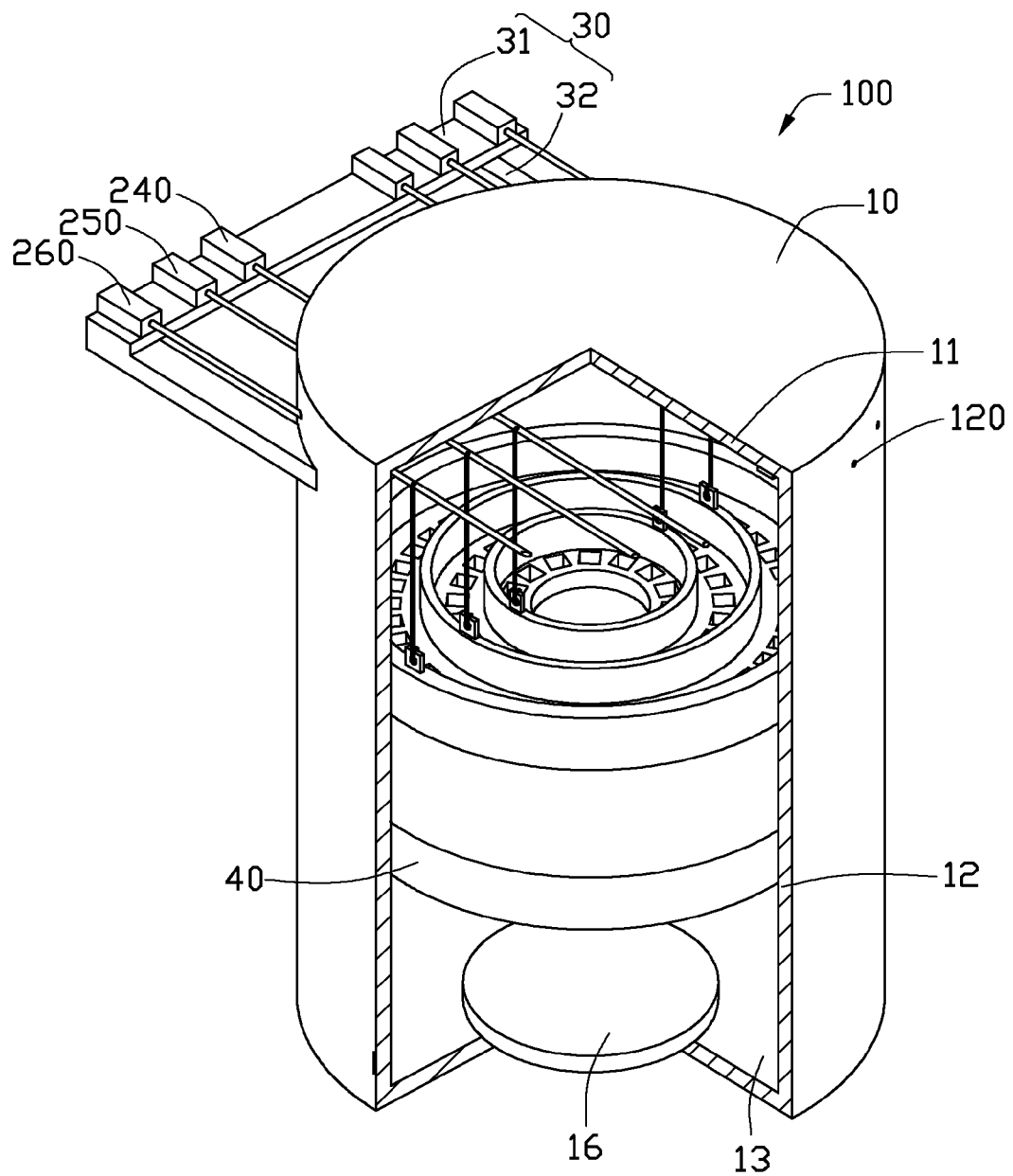
FIG. 1 is a cutaway view of one embodiment of a magnetron sputtering device, the magnetron sputtering device including a magnet mounting system.
Figure 2:
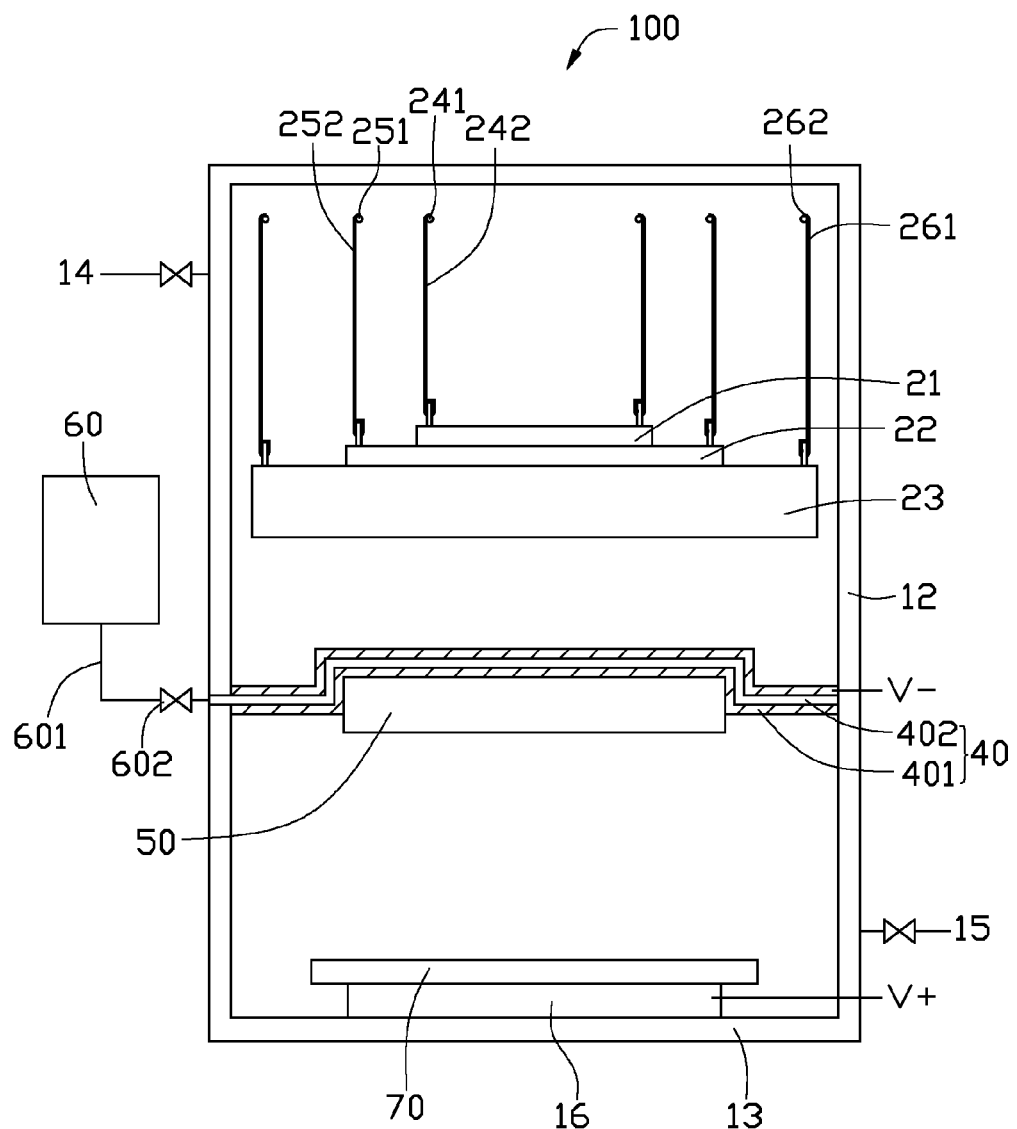
FIG. 2 is a cross-section view of the magnetron sputtering device of FIG. 1.
Figure 3:
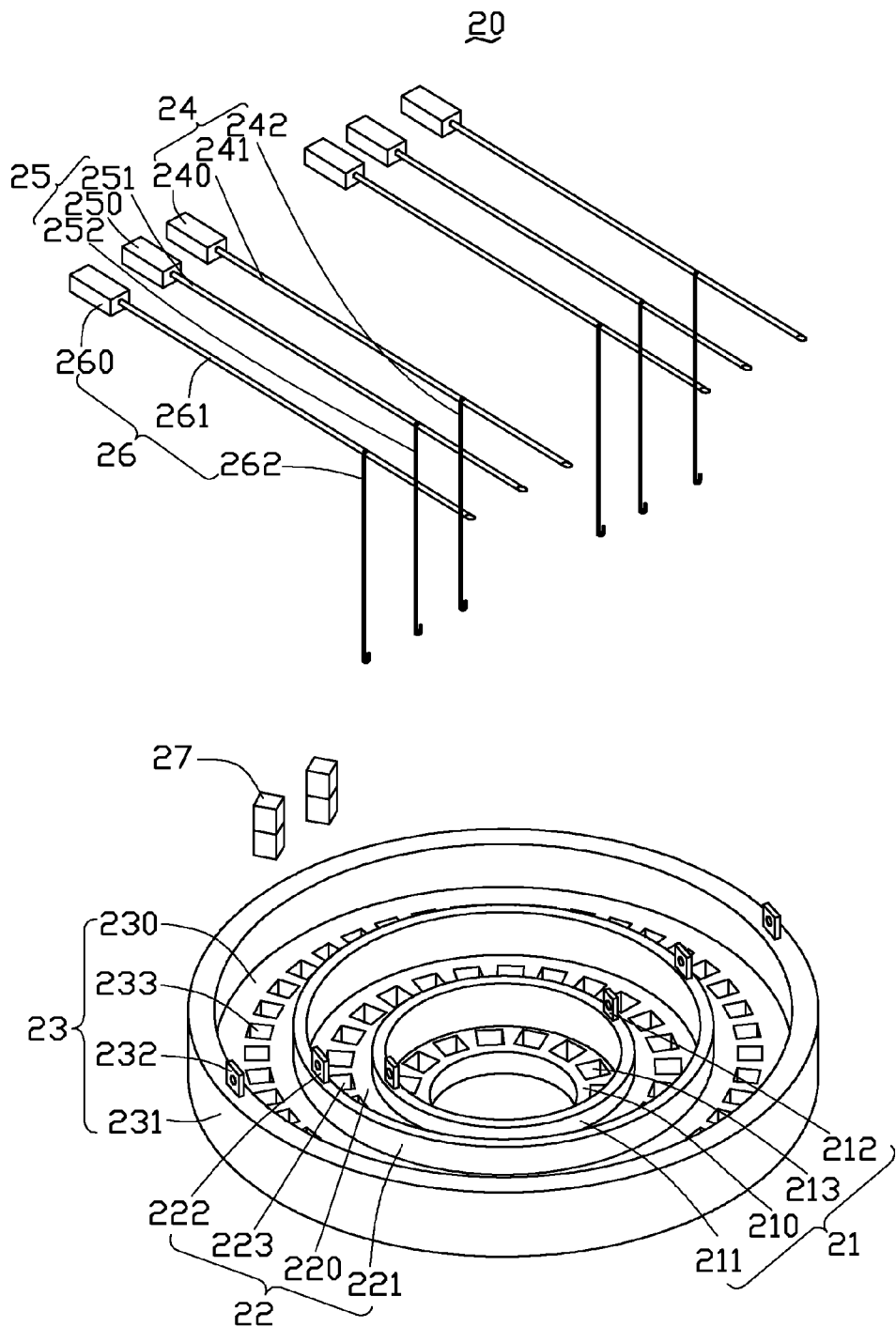
FIG. 3 is an exploded, isometric view of the magnet mounting system.

Referring to FIGS. 1-3, a magnetron sputtering device 100 includes a main body 10, a magnet mounting system 20, an external holder 30, and a target holder 40.

The main body 10 is generally cylindrical and includes a top plate 11, a tubular sidewall 12, a bottom plate 13 opposite to the top plate 11, an air outtake gate 14, an air intake gate 15, and a workpiece receiving portion 16. The sidewall 12 is connected between the top plate 11 and the bottom plate 13, and defines six pairs of through holes 120. Each pair of the through holes 120 is aligned with each other and positioned at a same height of the sidewall 12.

The magnet mounting system 20 includes a first annular member 21, a second annular member 22, a third annular member 23, a first driving device 24, a second diving device 25, and a third driving device 26, and a plurality of magnets 27. The first annular member 21, the second annular member 22, and the third annular member 23 are positioned in the main body 10 and coaxially encased one by one.

The external holder 30 is integrally formed and mounted on the exterior surface of the sidewall 12 and adjacent to the top plate 11. The external holder 30 comprises a beam portion 31 and two arm portions 32 extending from the two ends of the beam portion 31 to the sidewall 12. The two arm portions 32 are symmetrical about the center of the beam portion 31.

The first annular member 21 is made of ferrous material and includes a first annular base 210, a first annular sidewall 211, and two first ear portions 212. The first annular base 210 defines a plurality of receiving holes 213 annularly arranged in an upper surface thereof for receiving magnets 27. The first annular wall 211 extends from the outer periphery of the first annular base 210. The two first ear portions 212 diametrically protruding from an upper surface of the first annular wall 211 and are symmetrical about the center of the first annular wall 211.

The second annular member 22 is substantially similar to the first annular member 21 but has an inner diameter that is equal to or slightly greater than the outer diameter of the first annular member 21. In particular, the second annular member 22 is made of ferrous material and includes a second annular base 220, a second annular wall 221 extending from the outer periphery of the second annular base 210, two second ear portions 222. The second annular base 220 defines a plurality of receiving holes 223 annularly arranged in an upper surface thereof for receiving magnets 27. The two second ear portions 222 diameterically protruding from an upper surface of the second annular wall 221 and are symmetrical about the center of the second annular wall 221. The second annular member 22 encases the first annular sidewall 211. The first annular member 21 and the second annular member 22 are the same height, and the two first ear portions 212 and two second ear portions 222 are aligned with each other.

The third annular member 23 is substantially similar to the second annular member 22 but has an inner diameter that is equal to or slightly greater than the outer diameter of the second annular member 22. In particular, the third annular member 23 is made of ferrous material and includes a third annular base 230, a third annular wall 231 extending from the outer periphery of the third annular base 230, and two third ear portions 232. The third annular base 230 defines a plurality of receiving holes 233 annularly arranged in an upper surface thereof for receiving magnets 27. The two third ear portions 232 diametrically protruding from an upper surface of the third annular wall 231 and are symmetrical about the center of the third annular wall 231. The third annular member 23 encases the second annular sidewall 221. The first annular member 21, the second annular member 22, and the third annular member 23 are the same height, and the two second ear portions 222 and the two third ear portions 232 are aligned.

The first driving device 24 includes two first motors 240, two first shafts 241, and two first straps 242. The two first motors 240 are fixed adjacent to the center of the beam portion 31. The first shafts 241 are respectively rotatably connected to the two first motors 240 and received in two pairs of through holes 120. The two first motors 240 are operated synchronously. The first straps 242 are made of high temperature resistant material. One end of each first strap 242 is connected to a corresponding first ear portion 212, and the other end is wrapped on the first shaft 241.

The second driving device 25 has the same configuration as the first driving device 24, and includes two second motors 250, two second shafts 251, and two second straps 252. The two second motors 250 are respectively positioned near the two first motors 240 away from the center of the beam portion 31. The second shafts 251 are respectively rotatably connected to the two second motors 250 and received in another two pairs of through holes 120. One end of each first strap 252 is connected to a corresponding second ear portion 212, and the other end is wrapped on the first shaft 251.

The configuration of the third driving device 26 is the same as that of the first driving device 24 and includes two third motors 260, two third shafts 261, and two third straps 262. The two third motors 260 are respectively positioned near the second motors 250 away from the center of the beam 41. The third shafts 261 are respectively rotatably connected to the two third motors 260 and received in two pairs of corresponding through holes 120. One end of the third strap 262 is tied on a corresponding third ear portion 232, the other end is wrapped on the third shaft. When the unwrapped length of the first strap 242, the second strap 252, and the third strap 262 are identical, the first ear portions 212, the second ear portions 222, and the third ear portions 232 are aligned with each other.

The target holder 40 is made of metallic material and configured for holding a target member 50. The target holder 40 is mounted on the inner surface of the sidewall 12, and comprises a cooling plate 401 and a cooling tube 402 disposed in the cooling plate 401. The target member 50 is attached on the cooling plate 401. The workpiece receiving portion 16 is received in the main body 10 and positioned on the bottom plate 13. The workpiece receiving portion 16 is opposite to the target holder 40.

The sputtering coating device 100 further comprises a water cooling system 60. The water cooling system includes a pipe 601 and a controlling gate 602. The pipe 601 is connected to the cooling tube 401 to provide water to the target holder 40 to cool the target member 50.

During coating, atmosphere is first evacuated from the interior of the main body 10 through the outtake gate 14, and argon gas is introduced into the interior of the main body through the intake gate 15. Then, the cooling plate 401 is connected to a negative polarity (V−) of a high voltage and the workpiece receiving portion 16 is connected to a positive polarity (V+) of the high voltage. The argon will be ionized to Ar ions and electrons under the high voltage. The Ar ions bombard the target member 50, accelerated and directed by the electric fields provided by the high voltage. The magnets 27 received in the magnet mounting system 20 provide magnetic fields to control the electrons adjacent to the target member 50 to increase crashing probability with the Ar atoms.

During coating, the two first motors 240 can synchronously rotate the two first shafts 241 to wind or unwind the two first straps 242 to move the first annular member 21 along the axial direction of the first annular member 21, therefore, the distance between the first annular member 21 and the target member 50 can be adjusted to change the magnet field distribution. The distances between the second annular member 22 and the target member 50, between the third annular member 23 and the target member 50 can also be adjusted by the two second straps 252 and the two third straps 262 to change the magnet field distribution. When the magnet field distribution is changed, the moving track of electrons changes, and the crash positions between Ar atoms and electrons will change to produce Ar ions. Thus, the target member 50 can be uniformly bombarded and etched.

Figure 4:
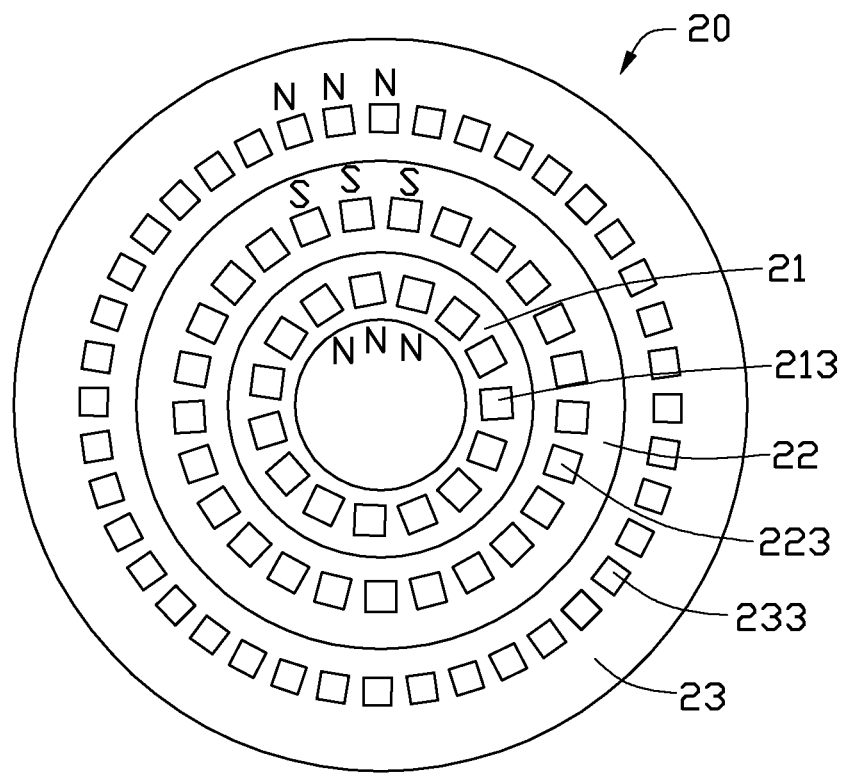
FIG. 4 is a bottom view of one embodiment of the magnet mounting system.

Referring to FIG. 4, in one embodiment, the polarity of the magnets 27 received in the first annular member 21 and the third annular member 23 facing a same direction, the polarity of the magnets 27 received in the second annular member 22 facing a direction different from the magnets 27 received in the first annular member 21 and the third annular member 23. For example, the north polarity of the magnets 27 received in the first annular member 21 and the third annular member 23 faces the target supporting frame 40. The south polarity of the magnets 27 received in the second annular member 22 faces the target holder 40.

Figure 5:
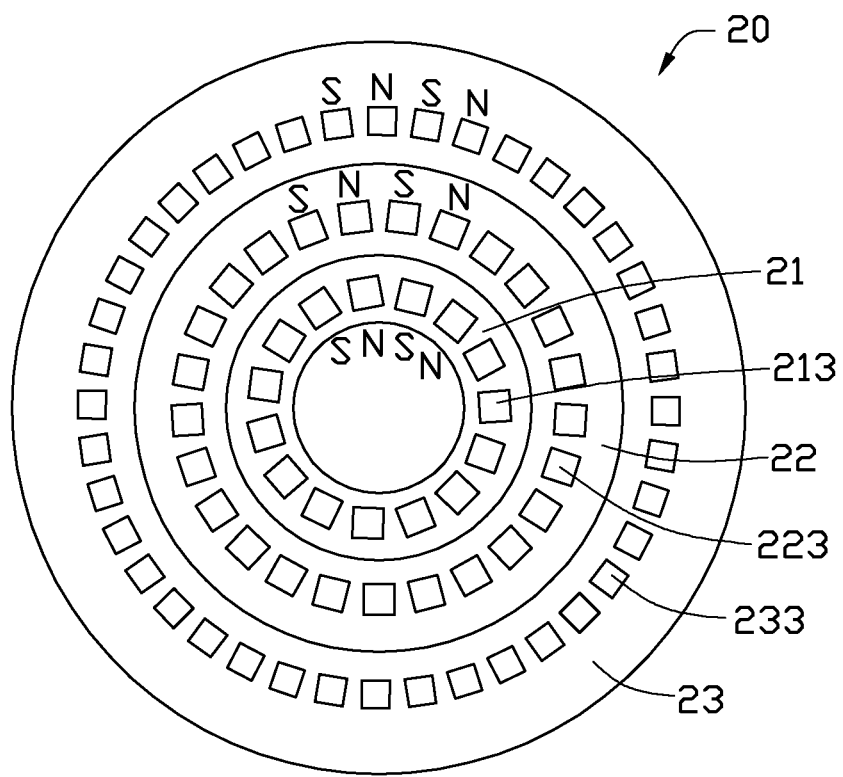
FIG. 5 is a bottom view of another embodiment of the magnet mounting system.

Referring to FIG. 5, in another embodiment, the polarities of the magnets received in the neighbored through holes in a same annular member are opposite to each other. Concretely, the polarities of the magnets 27 received in the neighbored receiving holes 213, 223, or 233 are opposite.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure

What is claimed is:

1. A magnetron sputtering device comprising:
 a main body;
 an external holder positioned on the outside of the main body; and
 a magnet mounting system comprising a first annular member and a first driving device mounted on the external holder;
 wherein the first annular member is positioned in the main body and connected to the first driving device, and the first driving device is configured for moving the first annular member along an axis of the first annular member; the magnetron sputtering device further comprises a second annular member and a second driving device, the second annular member coaxially encases the first annular member, the second driving device is mounted on the external holder and connected to the second annular member, and the second driving device is configured for moving the second annular member along the axis of the first annular member; the magnet mounting system further comprises a plurality of magnets, the magnets are received in the first and second annular members, the polarities of neighbored magnets received in the same annular member are opposite.

2. The magnetron sputtering device as claimed in claim 1, further comprising a third annular member and a third driving device, the third annular member coaxially encasing the second annular member, the third driving device mounted on the external device and connected to the third annular member, and the third driving device being configured for moving the third annular member along the axis of the first annular member.

3. The magnetron sputtering device as claimed in claim 2, wherein the first annular member comprises a first annular base, a first annular wall extending from the outer periphery of the first annular base, and two first ear portions diametrically protruding from an upper surface of the first annular wall, the first annular base defines a plurality of receiving holes.

4. The magnetron sputtering device as claimed in claim 3, wherein the first driving device comprises two first motors, two first shafts, and two first straps, the first motors are positioned on the external holder, the first shafts are respectively rotatably connected to the two first motors.

5. The magnetron sputtering device as claimed in claim 4, wherein one end of each first strap is connected to a corresponding first ear portion, and the other end is wrapped on a corresponding first shaft.

6. The magnetron sputtering device as claimed in claim 2, wherein the second annular member comprises a second annular base, a second annular wall extending from the outer periphery of the second annular base, and two second ear portions diametrically protruding from an upper surface of the second annular wall, the second annular base defines a plurality of receiving holes.

7. The magnetron sputtering device as claimed in claim 6, wherein the second driving device comprises two second motors, two second shafts, and two second straps, the second motors are positioned on the external holder, the second shafts are respectively rotatably connected to the two second motors.

8. The magnetron sputtering device as claimed in claim 7, wherein one end of each second strap is connected to a corresponding second ear portion, and the other end is wrapped on a corresponding second shaft.

9. The magnetron sputtering device as claimed in claim 2, wherein the third annular member comprises a third annular base, a third annular wall extending from the outer periphery of the third annular base, and two third ear portions diametrically protruding from an upper surface of the third annular wall, the third annular base defines a plurality of receiving holes.

10. The magnetron sputtering device as claimed in claim 9, wherein the third driving device comprises two third motors, two third shafts, and two third straps, the third motors are positioned on the external holder, the third shafts are respectively rotatably connected to the two third motors.

11. The magnetron sputtering device as claimed in claim 10, wherein one end of each third strap is connected to a corresponding third ear portion, and the other end is wrapped on a corresponding third shaft.

12. The magnetron sputtering device as claimed in claim 2, wherein the magnets are received in the third annular members, the polarities of neighbored magnets received in the third annular member are opposite.

13. The magnetron sputtering device as claimed in claim 1, wherein the main body is cylindrical and comprises a top plate, a sidewall, and a bottom plate, the sidewall is connected between the top plate and the bottom plate.

14. The magnetron sputtering device as claimed in claim 13, wherein the external holder integrally formed and mounted on the exterior surface of the sidewall and adjacent to the top plate.

15. A magnet mounting system, comprising:
a first annular member;
a second annular member coaxially encasing the first member;
a third annular member coaxially encasing the second member;
a first driving device connected to the first annular member and configured for driving the first annular member to move along an axis of the first annular member;
a second driving device connected to the second annular member and configured for driving the second annular member to move along the axis of the first annular member; and
a third driving device connected to the third annular member and configured for driving the third annular member to move along the axis of the first annular member;
a plurality of magnets, the magnets received in the first, second, and third annular members, wherein the polarities of neighbored magnets received in the same annular member are opposite.

* * * * *